(12) United States Patent
Welsh (10) Patent No.: US 11,171,736 B2
(45) Date of Patent: Nov. 9, 2021

(54) ULTRA-WIDE BAND ELECTROMAGNETIC JAMMING PROJECTOR

(71) Applicant: Battelle Memorial Institute, Columbus, OH (US)

(72) Inventor: Raphael Joseph Welsh, Powell, OH (US)

(73) Assignee: BATTELLE MEMORIAL INSTITUTE, Columbus, OH (US)

( * ) Notice: Subject to any disclaimer, the term of this patent is extended or adjusted under 35 U.S.C. 154(b) by 0 days.

(21) Appl. No.: 16/881,813

(22) Filed: May 22, 2020

(65) Prior Publication Data

US 2020/0374028 A1     Nov. 26, 2020

Related U.S. Application Data

(60) Provisional application No. 62/852,333, filed on May 24, 2019.

(51) Int. Cl.
*H04K 3/00*     (2006.01)
*G02B 27/10*     (2006.01)
(Continued)

(52) U.S. Cl.
CPC ........... *H04K 3/92* (2013.01); *G02B 27/1066* (2013.01); *H03H 11/32* (2013.01); *H03H 11/34* (2013.01);
(Continued)

(58) Field of Classification Search
CPC ........ H04K 2203/00; H04K 3/92; H04K 3/41; H03H 11/34
(Continued)

(56) References Cited

U.S. PATENT DOCUMENTS 3,953,851 A * 4/1976 Weidstam ................. G01S 7/38
                                                    342/14
2006/0038732 A1    2/2006 Deluca et al.
(Continued)

FOREIGN PATENT DOCUMENTS

WO    WO 2017/086855 A1    5/2017

OTHER PUBLICATIONS

International Search Report for International Application No. PCT/US2020/034119 dated Nov. 6, 2020.

*Primary Examiner* — John J Lee
(74) *Attorney, Agent, or Firm* — Fay Sharpe LLP (57) ABSTRACT

A radio frequency (RF) jamming device includes a differential segmented aperture (DSA), a jammer source outputting a jamming signal at one or more frequencies or frequency bands to be jammed, and RF electronics that amplify and feed the jamming signal to the DSA so as to emit a jamming beam. The DSA includes an array of electrically conductive tapered projections, and the RF electronics comprise power splitters configured to split the jamming signal to aperture pixels of the DSA. The aperture pixels comprise pairs of electrically conductive tapered projections of the array of electrically conductive tapered projections. The RF electronics further comprise pixel power amplifiers, each connected to amplify the jamming signal fed to a single corresponding aperture pixel of the DSA. The RF jamming device may include a rifle-shaped housing, with the DSA mounted at a distal end of the barrel of the rifle-shaped housing.

23 Claims, 3 Drawing Sheets

(51) Int. Cl.
  *H03H 11/32*   (2006.01)
  *H03H 11/34*   (2006.01)
  *H05K 1/02*    (2006.01)

(52) U.S. Cl.
  CPC ............ *H04K 3/41* (2013.01); *H04K 3/42* (2013.01); *H04K 3/825* (2013.01); *H05K 1/024* (2013.01); *H05K 1/0243* (2013.01); *H04K 2203/22* (2013.01); *H04K 2203/30* (2013.01); *H05K 2201/10098* (2013.01)

(58) Field of Classification Search
  USPC ........................................ 455/1, 67.11, 550.1
  See application file for complete search history.

(56) References Cited

U.S. PATENT DOCUMENTS

| | | | |
|---|---|---|---|
| 2007/0167131 A1* | 7/2007 | Nishida | H04N 5/445 455/1 |
| 2017/0250778 A1* | 8/2017 | Stamm | H01Q 21/22 |
| 2019/0173605 A1* | 6/2019 | Morrow | H01Q 21/22 |

* cited by examiner

Fig. 1

Fig. 2 though the drawings are not to scale; if any aspect of the drawings is indicated as being to scale, the illustrated scale is to be understood as non-limiting illustrative example.

ULTRA-WIDE BAND ELECTROMAGNETIC JAMMING PROJECTOR

This application claims the benefit of U.S. Provisional Application No. 62/852,333 filed May 24, 2019 and titled "ULTRA-WIDE BAND ELECTROMAGNETIC JAMMING PROJECTOR". U.S. Provisional Application No. 62/852,333 filed May 24, 2019 is incorporated herein by reference in its entirety.

BACKGROUND

The following relates to the radio frequency (RF) jamming arts, broadband RF jamming arts, and the like.

RF jamming finds application in numerous areas, such as disrupting control of radio-controlled vehicles such as unmanned aerial vehicles (UAVs), sometimes referred to as drones, disrupting illegal radio communications, and the like. Disruption of UAVs, for example, is an important countermeasure for preventing UAV operation in the airspace around airports, since a collision between a UAV and a commercial (or private) aircraft can severely damage or even bring down the aircraft. Similarly, countermeasures against UAVs are employed to protect government buildings and other sensitive areas that may be deemed high-value targets of malicious drone operators.

Some known devices employing RF jamming to counter UAVs are described in Stamm et al., U.S. Pat. No. 10,020,909 issued Jul. 10, 2018 and Morrow et al., U.S. Pat. No. 10,103,835 issued Oct. 16, 2018, both of which are incorporated herein by reference in their entireties.

Certain improvements are disclosed herein.

BRIEF SUMMARY

In accordance with some illustrative embodiments disclosed herein, a radio frequency (RF) jamming device comprises: a differential segmented aperture (DSA); a jammer source configured to output a jamming signal at one or more frequencies or frequency bands which are to be jammed; and RF electronics configured to amplify and feed the jamming signal to the DSA whereby the DSA emits a jamming beam at the one or more frequencies or frequency bands which are to be jammed. In some embodiments, the DSA comprises an array of electrically conductive tapered projections, and in some embodiments the RF electronics comprise power splitters configured to split the jamming signal to aperture pixels of the DSA wherein the aperture pixels comprise pairs of electrically conductive tapered projections of the array of electrically conductive tapered projections. In some embodiments, the RF electronics further comprise pixel power amplifiers wherein each pixel power amplifier is connected to amplify the jamming signal fed to a single corresponding aperture pixel of the DSA. Some embodiments further include a rotatable turret that enables the DSA to be rotated about a vertical axis to a desired azimuth angle. In some embodiments, the DSA comprises a plurality of DSAs arranged to provide RF jamming over a full 360 degree azimuth. In some embodiments, the RF jamming device further comprises a rifle shaped housing having a barrel, the DSA being mounted on the end of the barrel. In some of these latter embodiments, the DSA comprises an array of electrically conductive tapered projections facing outward from the end of the barrel.

In accordance with some illustrative embodiments disclosed herein, an RF jamming method comprises: generating a jamming signal at one or more frequencies or frequency bands which are to be jammed; and amplifying and feeding the jamming signal to a differential segmented aperture (DSA) whereby the DSA emits a jamming beam at the one or more frequencies or frequency bands which are to be jammed. In some such embodiments, the DSA comprises an array of electrically conductive tapered projections, and the amplifying and feeding comprises splitting the jamming signal to aperture pixels of the DSA wherein the aperture pixels comprise pairs of electrically conductive tapered projections of the array of electrically conductive tapered projections. Some embodiments further comprise amplifying the jamming signal fed to each aperture pixel individually using a corresponding pixel power amplifier.

BRIEF DESCRIPTION OF THE DRAWINGS

Any quantitative dimensions shown in the drawing are to be understood as non-limiting illustrative examples. Unless otherwise indicated, the drawings are not to scale; if any aspect of the drawings is indicated as being to scale, the illustrated scale is to be understood as non-limiting illustrative example.

DETAILED DESCRIPTION

Figure 1:
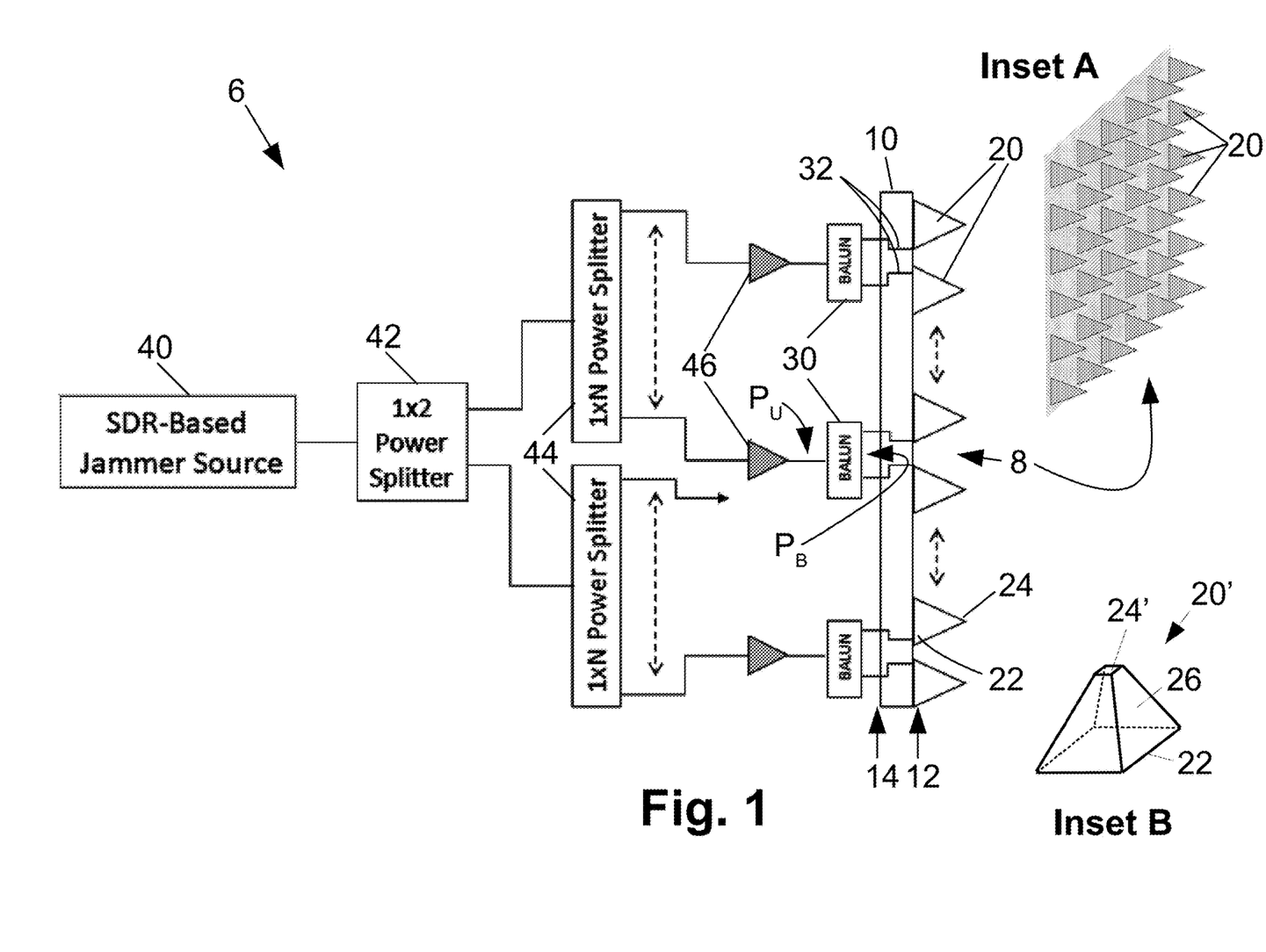
FIG. 1 diagrammatically illustrates a radio frequency (RF) jamming device. Inset A of FIG. 1 shows a perspective view of the illustrative differential segmented aperture (DSA) of the RF jamming device. Inset B of FIG. 1 shows a variant embodiment of the electrically conductive tapered projections.

With reference to FIG. 1, a diagrammatic view of a jamming device 6 is shown, which employs a differential segmented aperture (DSA) 8 which is shown in diagrammatic side sectional view in the main drawing of FIG. 1 and in diagrammatic perspective view in Inset A of FIG. 1. The illustrative DSA 8 includes a printed circuit board (PCB) 10 having a front side 12 and a back side 14, and an array of electrically conductive tapered projections 20 having bases 22 disposed on the front side 12 of the PCB 10 and extending away from the front side 12 of the PCB 10 and tapering to terminate in an apex 24. The electrically conductive tapered projections 20 can have any type of cross-section (e.g. square so as to form faceted electrically conductive tapered projections 20' as four-sided pyramids having four facets, as in Inset B, circular, hexagonal, i.e. faceted with six facets, octagonal, i.e. faceted with eight facets, or so forth). The apex 24' can be flat, as in the nonlimiting illustrative example four-sided pyramid electrically conductive tapered projection 20' of Inset B, or can come to a sharp point 20 as in the nonlimiting illustrative conical electrically conductive tapered projections 20, or can be rounded or have some other apex geometry. The rate of tapering as a function of height (i.e. distance "above" the base 22, with the apex 24 being at the maximum "height") can be constant, or the rate of tapering can be variable with height, e.g. the rate of tapering can increase with increasing height so as to form a projection with a rounded peak, or can be decreasing with increasing height so as to form a projection with a more pointed tip. Similarly, as best seen in FIG. 1, Inset A, the illustrative array of the electrically conductive tapered projections 20 is a rectilinear array with regular rows and orthogonal regular columns; however, the array may have other symmetry, e.g. a hexagonal symmetry, octagonal symmetry, or so forth. The sidewalls of the electrically conductive tapered projections 20 can have various sidewall shapes, e.g. a square base and square apex lead to having four flat slanted sidewalls; as another example, if the base and apex are circular (or the base is circular and the apex comes to a point) then the sidewall is suitably a slanted or tapering cylinder; as yet another example, for a hexagonal base and a hexagonal or pointed apex six slanted sidewalls are suitable, and so forth.

With continuing reference to FIG. 1, the RF aperture further comprises RF circuitry, which in the illustrative embodiment includes chip baluns 30 mounted on the back side 14 of the PCB 10. Each chip balun 30 has a balanced port PB electrically connected with two neighboring electrically conductive tapered projections 20 of the array of electrically conductive tapered projections via electrical feedthroughs 32 passing through the PCB 10. Each chip balun 30 further has an unbalanced port Pu connecting with the remainder of the RF circuitry. As will be further described, each chip balun 30 thus drives an aperture pixel comprising a pair of projections 20 connected with its balanced port PB by power received at its unbalanced port Pu. The illustrative RF circuitry further includes a software-defined radio (SDR) based jammer source 40 that generates a jamming signal at pre-defined or user-defined frequencies or frequency bands which are to be jammed; one or more RF power splitter 42, 44 for splitting the power generated by the SDR based jammer source 40 to the unbalanced ports Pu of the chip baluns 30, and a power amplifier 46 driving the unbalanced port Pu of each chip balun 30. In FIG. 1, the illustrative electrical configuration of the RF circuitry employs first level 1×2 RF power splitters 42 and second level 1×N RF power splitters 44 that further split the power to the baluns 30. It is alternatively contemplated to employ a single power splitter or to employ two (as illustrated), three, or more levels of power splitters, depending upon the number of aperture pixels to be driven and the rated power specifications for the power splitter components.

In the illustrative embodiment of FIG. 1, a compact design is achieved in part by employing one or more printed circuit boards (PCBs) including at least the illustrative PCB 10 on which are mounted the chip baluns 30. Additional electronic components of the RF circuitry (e.g., the power splitters 42, 44, the power amplifiers 46, and optionally also components of the SDR based jammer source 40, are suitably also mounted on the back side 14 of the PCB 10, and/or on one or more additional circuit boards (not shown), which may be mounted in parallel with and spaced apart from the illustrated PCB 10 using suitable standoffs; or may be mounted elsewhere, with the components of the optional additional PCB(s) (not shown) being electrically connected with the unbalanced ports Pu of the chip baluns 30 by electrical wiring. The illustrative RF circuitry includes chip baluns 30 mounted on the back side 14 of the PCB 10. Alternatively, the baluns 30 may be otherwise implemented, e.g., as baluns inscribed into the PCB 10. In another approach, RF circuitry driving the RF aperture may be entirely differential signal chains, in which case the baluns can be omitted.

The jamming device 6 employs the DSA 8 as the jamming signal output aperture. The balanced ports PB of the chip baluns 30 connect adjacent (i.e. neighboring) pairs of electrically conductive tapered projections 20 of the array to apply a differential RF signal received at the unbalanced port Pu of the chip balun 30 between the two adjacent electrically conductive tapered projections 20. Operation of pairs of electrically conductive tapered projections in radiating RF power is described in Steinbrecher, U.S. Pat. No. 7,420,522 which is incorporated herein by reference in its entirety. The tapering of the electrically conductive tapered projections 20 presents a separation between the two electrically conductive tapered projections 20 that continuously varies with the "height", i.e. with distance "above" the base 22 of the electrically conductive tapered projections 20. This provides the DSA 8 with broadband RF functionality since a large range of RF wavelengths can be coupled corresponding to the range of separations between the adjacent electrically conductive tapered projections 20 introduced by the tapering. The DSA 8 thus has differential RF transmit elements corresponding to the adjacent pairs of electrically conductive tapered projections 20. These differential RF transmit elements are referred to herein as aperture pixels. For example, the illustrative rectilinear 6×6 array of adjacent electrically conductive tapered projections 20 shown in Inset A of FIG. 1 has five aperture pixels along each row (or column) of six electrically conductive tapered projections 20. More generally, for a rectilinear array of projections having a row (or column) of N electrically conductive tapered projections 20, there will be a corresponding N-1 aperture pixels along the row (or column).

The SDR based jammer source 40 advantageously employs a suitably programmed microprocessor or microcontroller and associated digital electronics (e.g. random access memory or other electronic storage) to generate a digital jamming signal at a desired set of one or more frequencies to be jammed that is converted to an analog jamming signal using digital-to-analog (D/A) circuitry. Use of a SDR advantageously promotes configurability as the choice of jamming frequencies (or frequency bands) can be configured in software of the SDR. However, it is alternatively contemplated to employ an analog jammer source in place of the SDR based jammer source 40.

In operation, the jammer source 40 is configured to output a jamming signal at one or more frequencies or frequency bands which are to be jammed. The RF electronics 42, 44, 46 are configured to amplify and feed the jamming signal to the DSA 8, whereby the DSA 8 emits a jamming beam at the one or more frequencies or frequency bands which are to be jammed. The configuration of the jammer source may be hard wired, e.g. the jammer source may be an analog RF circuit that generates an RF signal at the one or more frequencies or frequency bands which are to be jammed. In the illustrative embodiment, the SDR based jammer source 40 is configured by software programming of the SDR to generate a digital signal at the one or more frequencies or frequency bands which are to be jammed that is then converted to an analog RF signal by a D/A converter. In a variant embodiment, the SDR may generate the digital signal mapped to the one or more frequencies or frequency bands which are to be jammed, which is then converted to an analog RF signal by a D/A converter and then heterodyned in the analog domain to the one or more frequencies or frequency bands which are to be jammed. These are merely some non-limiting illustrative examples, and more generally any SDR based RF signal generation system can be employed as the SDR based jammer source 40. In some embodiments, the SDR includes a user interface (e.g., see the examples described with reference to FIGS. 3 and 5) via which a user can select the one or more frequencies or frequency bands which are to be jammed.

The described configuration employing the PCB 10 with its front side 12 serving as a mounting surface for the electrically conductive tapered projections 20 of the DSA 8 and the chip baluns 30 mounted on its back side 14 advantageously enables the jamming device 6 to be made compact and lightweight. As described next, embodiments of the electrically conductive tapered projections 20 further facilitate providing a compact and lightweight jamming device 6.

Figure 2:
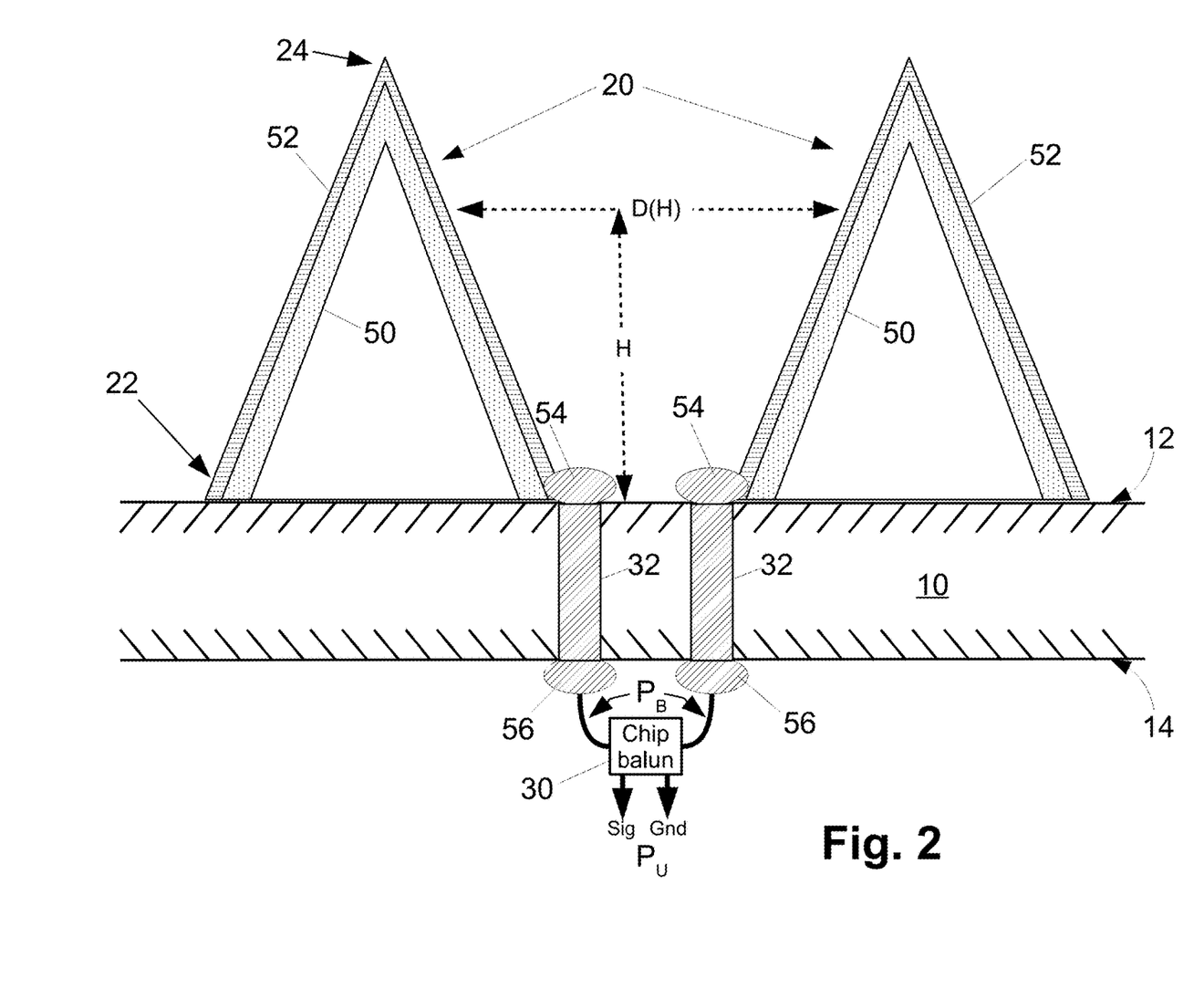
FIG. 2 diagrammatically shows a side sectional view of an embodiment of the electrically conductive tapered projections, along with a diagrammatic representation of the connection of the balanced port of a chip balun between two adjacent electrically conductive tapered projections forming an aperture pixel.

FIG. 2 shows a side sectional view of one illustrative embodiment in which each electrically conductive tapered projection 20 is fabricated as a dielectric tapered projection 50 with an electrically conductive layer 52 disposed on a surface of the dielectric tapered projection 50. The dielectric tapered projections may, for example, be made of an electrically insulating plastic or ceramic material, such as acrylonitrile butadiene styrene (ABS), polycarbonate, or so forth, and may be manufactured by injection molding, three-dimensional (3D) printing, or other suitable techniques. The electrically conductive layer 52 may be any suitable electrically conductive material such as copper, a copper alloy, silver, a silver alloy, gold, a gold alloy, aluminum, an aluminum alloy, or so forth, or may include a layered stack of different electrically conductive materials, and may be coated onto the dielectric tapered projection 50 by vacuum evaporation, RF sputtering, or any other vacuum deposition technique. FIG. 2 shows an example in which solder points 54 are used to electrically connect the electrically conductive layer 52 of each dielectric tapered projection 20 with its corresponding electrical feedthrough 32 passing through the PCB 10. FIG. 2 also shows the illustrative connection of the balanced port PB of one chip balun 30 between two adjacent electrically conductive tapered projections 20 via solder points 56.

It is to be understood that the DSA manufacturing design of FIG. 2 is merely an illustrative example, and numerous other approaches for fabricating the DSA 8 are contemplated. For example, the electrically conductive tapered projections 20 may be solid metal cones (or otherwise shaped tapered projections), formed as freestanding metal shells by sheet metal punching or other sheet metal processing techniques, or so forth. Moreover, the illustrative PCB 10 can be replaced by another DSA substrate, with electrical wiring provided to electrically connect the aperture pixels of the DSA to the RF electronics. These are merely further illustrative examples.

In the illustrative design of FIG. 1, each power amplifier 46 drives an individual aperture pixel of the DSA 8. Said another way, each pixel power amplifier 46 is connected to amplify the jamming signal fed to a single corresponding aperture pixel of the DSA 8. Accordingly, the power amplifiers 46 are also referred to herein as pixel power amplifiers 46. The gain provided by the pixel power amplifier 46 (in combination with any optional further amplifiers, not shown, optionally interposed between the SDR based jammer source 40 and the pixel power amplifier 46) is referred to herein as the aperture gain. As the jamming signal input to each aperture pixel is individually amplified by its corresponding pixel power amplifier 46, the individual pixel power amplifiers 46 can be of lower power rating as compared with an RF aperture that is driven by a jamming signal amplified by a single power amplifier driving the entire RF aperture.

Moreover, the power at any point in space in the far field is an additive combination of the power from each aperture pixel. This is referred to as the spatial gain.

These two gains: aperture gain due to the size of the effective aperture, and spatial gain due to the combination of power from the individual aperture pixels in the far field, are additive. Consequently, the Effective Isotropic Radiated Power (EIRP) in the far field is the additive sum of the aperture gain and spatial gain in decibels. This enables the jamming device 6 to output high jamming power in the far field while using relatively small pixel power amplifiers 46. For example, if a 16 pixel DSA, each having a 30 dBm power amplifier connected as shown in FIG. 1, configured as a 5"×5" physical aperture (that is, five inch square physical aperture) operating with 100% efficiency (that is, the physical aperture equals the effective aperture), then the total EIRP in the far field will be the sum of the two gains. So, for a jamming frequency of 2.4 GHz, the calculated aperture gain will be approximately 7 dBi and the spatial gain will be equal to 10*Log(16) or 12 dB. Since each pixel has a 30 dBm amplifier connected, the total EIRP would be 30 dBm+12 dB+7 dB or 49 dBm. If each of the power amplifiers has a 30 dB gain, and the splitting loss is 12 dB (16 power divisions), an SDR would only have to source 30 dBm−30 dB+12 dB or 12 dBm to realize the full 49 dBm EIRP, neglecting small insertion losses.

Furthermore, this high EIRP can be provided over a wide beam angle. A square planar DSA results in a beam pattern that is directional in nature. An estimate of the beam width (in radians) of a square, flat DSA is given by the following equation:

$$\text{Beamwidth(rad)} = 2 \cdot \cos^{-1}\left(1 - \frac{\lambda^2}{2\pi A_{\textit{eff}}}\right) \qquad (1)$$

where $\lambda$ is the wavelength of the RF signal, and $A_{\textit{eff}}$ is the effective area of the RF aperture. As the effective area ($A_{\textit{eff}}$) decreases, the beamwidth increases (albeit with a lower gain as the total power is spread out into the larger beamwidth).

Still further, with reference back to FIG. 2, the DSA 8 is a broadband RF aperture due to the large range of frequencies that can couple with the aperture pixels. FIG. 2 diagrammatically indicates that, at a "height" H above the base 22 of the electrically conductive tapered projections 20, the projections 20 of the aperture pixel are spaced apart by a distance D(H). This spacing range from a minimum spacing at the base 22 of D(0) to a maximum spacing at the apex 24 of D($H_{apex}$). The band of wavelengths that can couple then corresponds to the continuous range of spacings [D(0),D($H_{apex}$)], and can be recast as the aperture frequency band using the conversion f$\lambda$=c where f is frequency, $\lambda$ is the wavelength, and c is the speed of light.

The combination of the SDR based jammer source 40 (see FIG. 1) and the wide bandwidth of the DSA 8, along with the efficiently obtained high far field power achievable with the DSA 8, enables the jamming device 6 to be programmed in the field (or, alternatively, pre-programmed) to jam radio signals at any desired frequency, combination of frequencies, band of frequencies, or set of disjoint bands of frequencies.

Figures 3, 4, 5:
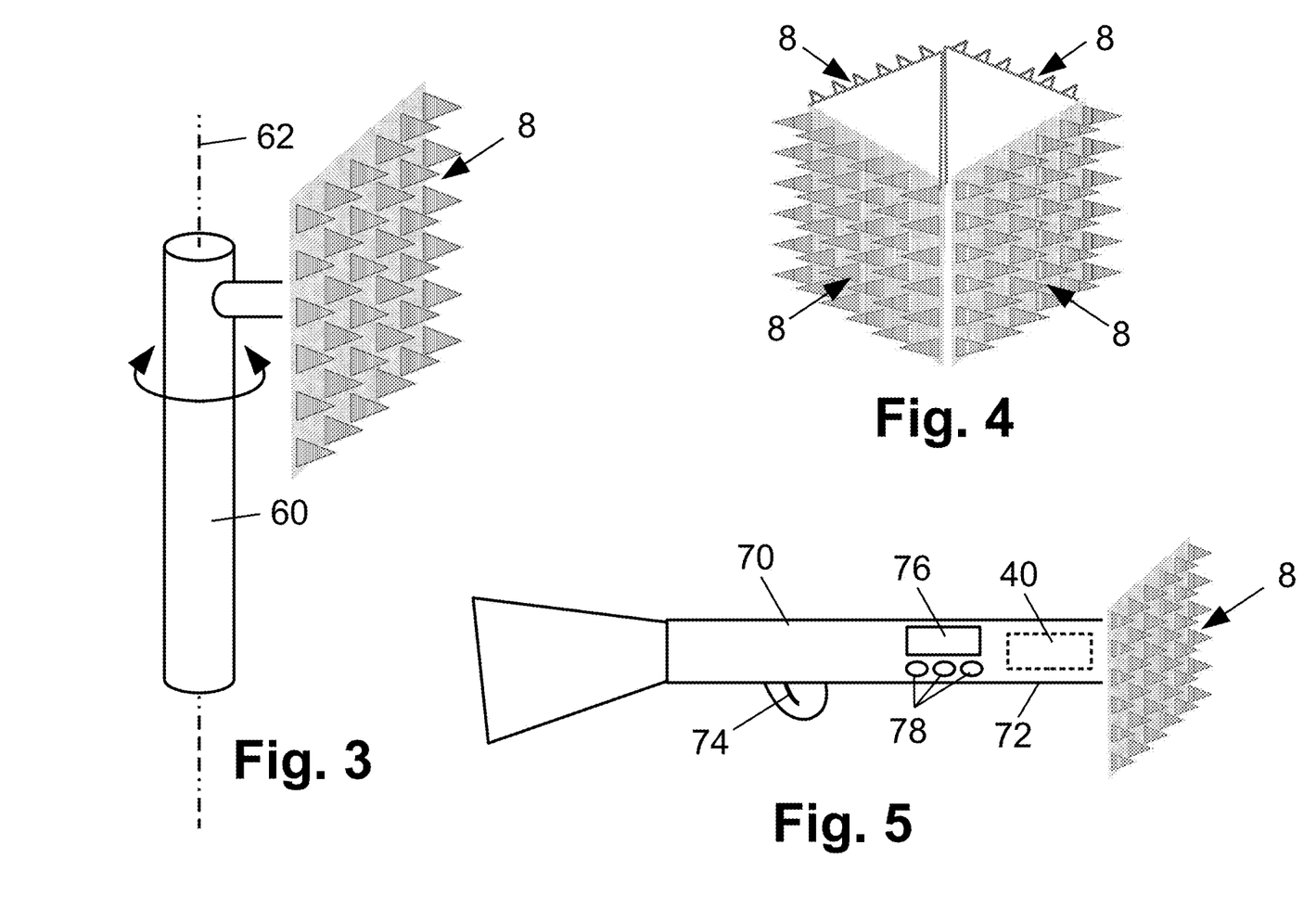
FIG. 3 diagrammatically illustrates a jamming station employing the DSA of FIG. 1 on a rotatable turret.
FIG. 4 diagrammatically shows arranging a plurality of DSAs of the type shown in FIG. 1 to provide full 360 degrees azimuth jamming.
FIG. 5 diagrammatically shows a portable jamming device having a rifle form factor, which employs a DSA of the type shown in FIG. 1.

With non-limiting illustrative reference to FIGS. 3-5, the jamming device 6 of FIG. 1 can be deployed in various ways. FIG. 3 illustrates a deployment on a rotatable turret 60 that enables a single planar DSA 8 to be rotated about a vertical axis 62 so as to be positioned at a desired azimuth angle. The turret 60 may be a fixed mounting, or could be mounted in the bed of a truck or other vehicle (not shown) in order to provide a mobile jamming station. The illustrative turret 60 positions the DSA 8 to generate a horizontally directed jamming beam. Alternatively, the DSA 8 could be mounted at some other angle, e.g. at a shallow elevation to increase jamming capacity at higher elevations. In another contemplated variant, a further joint (not shown) could be provided to enable tilting of the DSA 8 about a horizontal axis to enable jamming directed at a user-selected elevation. The geometry of the DSA 8 could also be tuned to provide an asymmetric beam. For example, a wider vertical beamwidth compared with a narrower horizontal beamwidth could be achieved by making the DSA rectangular with a longer horizontal dimension and a shorter vertical dimension. In one suitable implementational approach, the power splitters 42, 44 and pixel power amplifiers 46 shown in FIG. 1 are integrated with the planar DSA 8 (e.g. being mounted on the PCB 10 and, if needed, on an additional one or more PCBs mounted in parallel with the illustrated PCB 10 using suitable standoffs. The SDR based jammer source 40 may be mounted remotely from the DSA 8, for example in the bed or cab of the vehicle in embodiments in which the rotating turret 60 is vehicle-mounted. In this approach, for example, the SDR based jammer source 40 may comprise a notebook computer providing the microprocessor and non-transitory storage medium (e.g. hard drive or solid state drive, SSD) storing the SDR software, with the computer connected via a USB port or other digital communication link with external intermediary RF circuitry including a D/A converter and an optional power (pre-)amplifier feeding into the base-level power splitter(s) 42 of FIG. 1. Advantageously, the computer could also run software providing control for the rotation mechanism of the turret 60, so that a user sitting in the cab of the vehicle could set the azimuth direction of the DSA 8 via the turret 60 (and the elevation, if a further elevation adjustment is provided for the DSA 8) and select the frequency or frequencies or frequency band or bands to be jammed, as well as the total jamming power.

FIG. 4 illustrates an example in which four DSAs 8 are arranged at 0 degree, 90 degree, 180 degree, and 270 degree azimuth angles (referenced to an arbitrary 0 degree azimuth angle) forming a cube so as to provide full 360 degree azimuth coverage. This assumes that each DSA 8 has a horizontal beamwidth of at least 90 degrees. If the DSAs have a smaller horizontal beamwidth than this, then additional planar DSAs may be added, e.g. six planar DSAs at 0, 60, 120, 180, 240, and 300 degree azimuth angles thereby forming a hexagon. In a variant embodiment, the illustrative flat DSAs 8 can be replaced by DSAs having a curved surface to increase the beamwidth (albeit possibly at the loss of some spatial gain). For example, the curved surface could be manufactured to be conformal with a curved surface of the fuselage of an aircraft or unmanned aerial vehicle (UAV), or to be conformal with the hull of an ocean-going ship or submarine, or to be conformal with a surface of a round or cylindrical orbiting satellite, or so forth. Each planar DSA 8 in the embodiment of FIG. 4 includes the PCB 10 and the RF electronics as shown in FIG. 1, except that in the embodiment of FIG. 4 it is contemplated for a single instance of the SDR based jammer source 40 to drive all four DSAs 8 of the embodiment of FIG. 4 by way of a further 1×4 power splitter (not shown). In one contemplated practical implementation, the assembly shown in FIG. 4 is mounted on a fixed tower to provide omnidirectional jamming over the full 360 degrees of azimuth.

FIG. 5 illustrates an example of a portable jamming device having a rifle form factor, which employs a single instance of the planar DSA 8. The rifle form factor is provided by a rifle-shaped housing 70 having a barrel 72, and the DSA 8 is mounted on the distal end of the barrel 72 with the array of electrically conductive tapered projections 20 facing outward from the end of the barrel 72. (Said another way, the array of electrically conductive tapered projections 20 are oriented to generate the jamming beam directed outward from the barrel in the direction that a bullet would be fired if the rifle-shaped housing 70 were an actual rifle). In the illustrative embodiment, the SDR based jammer source 40 (indicated diagrammatically by dashed lines in FIG. 5 to indicate an internal component). The power splitters 42, 44 and pixel power amplifiers 46 may be mounted integrally with the DSA 8 as described for the embodiment of FIG. 3, or may be disposed inside the rifle-shaped housing 70 and connected with the DSA 8 by suitable wiring in the "barrel" of the rifle-shaped housing 70. Some portable jamming devices having rifle form factors are described in Stamm et al., U.S. Pat. No. 10,020,909 issued Jul. 10, 2018 and Morrow et al., U.S. Pat. No. 10,103,835 issued Oct. 16, 2018, both of which are incorporated herein by reference in their entireties. The rifle-shaped housing 70 further supports a trigger 74 by which an operator energizes the DSA 8 to emit a jamming beam. The illustrative rifle-shaped housing 70 further has a display 76 and user controls 78 mounted thereon by which a user can read and adjust settings of the SDR based jamming source 40, respectively. (While user controls 78 separate from the display 76 are shown, it is contemplated for the display and the user controls to be integrated together, e.g. in the form of a touch-screen display in which user controls are displayed on the display and are operated by user touches to the display). This enables the user to select the jamming frequency, frequencies, frequency band, or frequency bands in the field. (Other user interfacing hardware is contemplated, for example a mobile device application program or "app" running on a cellphone, tablet computer, or the like may be used to interface wirelessly with the SDR based jamming source 40). The portable jamming device of FIG. 5 can be useful, for example, in disrupting operation of an unmanned aerial vehicles (UAV), sometimes referred to as a drone, if it is impinging upon the controlled airspace of a commercial airport or other security-sensitive location.

In some embodiments, it is contemplated for the jamming device 6 to provide jamming capability over a broad spectrum of communications from 4 MHz to 6 GHz, although a larger, smaller, or different broad spectrum operation range is also contemplated. In one non-limiting illustrative example, the jamming device 6 provides jamming capability over a broad spectrum encompassing the unlicensed "Industrial Scientific Manufacturing" (ISM) bands in which many drones are currently operated. Again, these are merely non-limiting illustrative examples, and the broad spectrum of operation is suitably designed based on the shapes of the electrically conductive tapered projections 20 so as to design the D(H) function described with reference to FIG. 2 and by the operating frequency ranges of the SDR based jammer source 40 and power distribution/amplification RF electronics 30, 42, 44, 46.

The jamming device 6 operates in transmit mode to output a jamming beam. In some embodiments (including the illustrative embodiment), the jamming device 6 is not configured to receive an RF signal via the DSA 8. For example, the jamming device 6 does not include RF electronics configured to receive an RF signal via the DSA 8. Similarly, the SDR of the SDR based jammer source 40 is not programmed to process a received RF signal.

In other embodiments, it is contemplated to provide receive capability to assist in the jamming process. For example, it is contemplated (although not illustrated) to include receive capability (e.g. the illustrated RF electronics can be configured to receive an RF signal via the DSA 8, for example using suitable RF switches to switch out the transmit power amplifiers 46 and switch in receive amplifiers (not shown), with the splitters 42, 44 being RF combiner/splitter components to enable conveying the received RF signal, and the SDR based jamming source 30 being further programmed to process the received RF signal. For example, such RF receive capability may be useful in the embodiment of FIG. 5 to automatically set the one or more frequencies or frequency bands which are to be jammed. This can be done by receiving the broadband signal at intervals while the trigger 74 is pulled (indicating the device is pointed at the UAV to be jammed). Under the assumption that the strongest RF signal in this state will be at the one or more frequencies or frequency bands transmitted by the UAV, the SDR based jammer source 40 can then automatically configure (by suitable programming of the SDR) to output a jamming signal at the one or more frequencies or frequency bands which dominate the received RF signal, so as to jam those frequencies. The preferred embodiments have been illustrated and described. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A radio frequency (RF) jamming device comprising:
   a differential segmented aperture (DSA) comprising an array of electrically conductive tapered projections;
   a jammer source configured to output a jamming signal at one or more frequencies or frequency bands which are to be jammed; and
   RF electronics configured to amplify and feed the jamming signal to the DSA whereby the DSA emits a jamming beam at the one or more frequencies or frequency bands which are to be jammed.

2. The RF jamming device of claim 1 further comprising:
   a printed circuit board (PCB) having a front side on which the array of electrically conductive tapered projections is disposed.

3. The RF jamming device of claim 1 wherein the electrically conductive tapered projections comprise:
   dielectric tapered projections; and
   an electrically conductive layer disposed on a surface of the dielectric tapered projections.

4. The RF jamming device of claim 1 wherein the jammer source comprises a software defined radio (SDR) based jammer source.

5. The RF jamming device of claim 1 wherein the DSA includes at least one printed circuit board (PCB) having a front side on which the array of electrically conductive tapered projections is disposed, wherein the RF electronics are also mounted on the at least one PCB.

6. The RF jamming device of claim 1 wherein the RF electronics are further configured to receive an RF signal via the DSA and to automatically set the jamming signal at one or more frequencies or frequency bands which dominate the received RF signal.

7. The RF jamming device of claim 1 wherein the DSA comprises a plurality of DSAs arranged to provide RF jamming over a full 360 degree azimuth.

8. The RF jamming device of claim 1 further comprising a rifle shaped housing having a barrel, the DSA being mounted on the end of the barrel.

9. The RF jamming device of claim 8 wherein the array of electrically conductive tapered projections are arranged facing outward from the end of the barrel.

10. The RF jamming device of claim 8 wherein the jammer source is housed inside the rifle shaped housing.

11. The RF jamming device of claim 10 wherein the jammer source comprises a software defined radio (SDR) based jammer source and the RF jamming device further comprises a display and user controls disposed on the rifle shaped housing, wherein the display and user controls are operative to enable a user to select the one or more frequencies or frequency bands which are to be jammed.

12. The RF jamming device of claim 11 wherein the display and user controls comprise a touch-screen display providing the user controls.

13. The RF jamming device of claim 1 wherein the RF jamming device is not configured to receive an RF signal via the DSA.

14. A radio frequency (RF) jamming device comprising:
    a differential segmented aperture (DSA) comprising an array of electrically conductive tapered projections;
    a jammer source configured to output a jamming signal at one or more frequencies or frequency bands which are to be jammed; and
    RF electronics configured to amplify and feed the jamming signal to the DSA whereby the DSA emits a jamming beam at the one or more frequencies or frequency bands which are to be jammed;
    wherein the RF electronics comprise power splitters configured to split the jamming signal to aperture pixels of the DSA wherein the aperture pixels comprise pairs of electrically conductive tapered projections of the array of electrically conductive tapered projections.

15. The RF jamming device of claim 14 wherein the RF electronics further comprise pixel power amplifiers wherein each pixel power amplifier is connected to amplify the jamming signal fed to a single corresponding aperture pixel of the DSA.

16. The RF jamming device of claim 14 wherein the RF electronics further comprise baluns each having an unbalanced port connected with an output of a power splitter and a balanced port connected with the pair of electrically conductive tapered projections of a single corresponding aperture pixel.

17. The RF jamming device of claim 16 further comprising:
    a printed circuit board (PCB) having a front side on which the array of electrically conductive tapered projections is disposed and a backside on which the baluns are disposed as chip baluns, wherein the unbalanced ports of the chip baluns connect with the aperture pixels via electrical feedthroughs passing through the PCB.

18. A radio frequency (RF) jamming device comprising:
    a differential segmented aperture (DSA);
    a jammer source configured to output a jamming signal at one or more frequencies or frequency bands which are to be jammed;

RF electronics configured to amplify and feed the jamming signal to the DSA whereby the DSA emits a jamming beam at the one or more frequencies or frequency bands which are to be jammed; and a rotatable turret that enables the DSA to be rotated about a vertical axis to a desired azimuth angle.

19. A radio frequency (RF) jamming method comprising:

generating a jamming signal at one or more frequencies or frequency bands which are to be jammed; and amplifying and feeding the jamming signal to a differential segmented aperture (DSA) comprising an array of electrically conductive tapered projections whereby the DSA emits a jamming beam at the one or more frequencies or frequency bands which are to be jammed.

20. The RF jamming method of claim 19 wherein:

the amplifying and feeding comprises splitting the jamming signal to aperture pixels of the DSA wherein the aperture pixels comprise pairs of electrically conductive tapered projections of the array of electrically conductive tapered projections.

21. The RF jamming method of claim 20 wherein the amplifying and feeding further comprises:

amplifying the jamming signal fed to each aperture pixel individually using a corresponding pixel power amplifier.

22. The RF jamming device of claim 19 wherein the generating comprises:

generating the jamming signal using a software defined radio (SDR).

23. The RF jamming method of claim 19 further comprising:

rotating the DSA to a desired azimuth angle.

* * * * *